US012641748B2

(12) United States Patent
Shaw et al.

(10) Patent No.: US 12,641,748 B2
(45) Date of Patent: May 26, 2026

(54) HOUSING FOR IMMERSIVE LIQUID COOLING OF MULTIPLE ELECTRONIC DEVICES

(71) Applicant: ICEOTOPE GROUP LIMITED, South Yorkshire (GB)

(72) Inventors: Andrew Shaw, Sheffield (GB); Jasper Kidger, Glossop (GB); Neil Edmunds, Sheffield (GB); David Amos, Sheffield (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 0 days.

(21) Appl. No.: 17/798,374

(22) PCT Filed: Feb. 11, 2021

(86) PCT No.: PCT/GB2021/050332
§ 371 (c)(1),
(2) Date: Aug. 9, 2022

(87) PCT Pub. No.: WO2021/161026
PCT Pub. Date: Aug. 19, 2021

(65) Prior Publication Data
US 2023/0083799 A1      Mar. 16, 2023

(30) Foreign Application Priority Data
Feb. 11, 2020    (GB) ..................................... 2001872

(51) Int. Cl.
*H05K 7/20*      (2006.01)
*G06F 1/20*      (2006.01)

(52) U.S. Cl.
CPC .......... *H05K 7/20218* (2013.01); *G06F 1/20* (2013.01); *G06F 2200/201* (2013.01); *H05K 7/20645* (2013.01)

(58) Field of Classification Search
CPC .......... H05K 7/20218; H05K 7/20645; H05K 7/20236; H05K 7/20809; H05K 7/20781;
(Continued)

(56) References Cited

U.S. PATENT DOCUMENTS 4,912,600 A      3/1990 Jaeger
2006/0072241 A1*      4/2006 Feliss ........................ G06F 1/20
361/679.33
(Continued)

FOREIGN PATENT DOCUMENTS

EP      3279764 A1      2/2018
EP      3460624 A1      3/2019
(Continued)

OTHER PUBLICATIONS

International Search Report and Written Opinion issued in App. No. PCT/GB2021/050332, mailing date May 7, 2021, 13 pages.
(Continued)

*Primary Examiner* — Jayprakash N Gandhi
(74) *Attorney, Agent, or Firm* — Bochner PLLC; Andrew D. Bochner

(57) ABSTRACT

A housing is provided for mounting within an enclosure, for example a module for cooling electronic devices, that is arranged to contain a liquid coolant. The housing comprises: a wall structure, arranged to define a plurality of mounting chambers, each mounting chamber being configured to hold at least one respective electronic device and having a respective chamber coolant inlet for receiving liquid coolant, such that liquid coolant received through each chamber coolant inlet accumulates in the respective mounting chamber around the respective electronic device; a housing coolant inlet, for receiving liquid coolant from outside the housing; and a liquid coolant manifold, arranged to receive
(Continued)

liquid coolant from the housing coolant inlet and provide the received liquid coolant to each of the chamber coolant inlets.

22 Claims, 5 Drawing Sheets

(58) Field of Classification Search
CPC ..... H01L 23/473; H01L 23/3675; G06F 1/20; G06F 2200/201
See application file for complete search history.

(56) References Cited

U.S. PATENT DOCUMENTS

| | | | | |
|---|---|---|---|---|
| 2009/0260777 | A1* | 10/2009 | Attlesey | H01L 23/473 |
| | | | | 165/104.33 |
| 2013/0105120 | A1* | 5/2013 | Campbell | H05K 7/203 |
| | | | | 165/104.21 |
| 2014/0211412 | A1* | 7/2014 | Best | G11B 33/1413 |
| | | | | 361/679.47 |
| 2014/0218861 | A1* | 8/2014 | Shelnutt | H05K 7/20818 |
| | | | | 361/679.53 |
| 2015/0359132 | A1* | 12/2015 | Campbell | H05K 7/20236 |
| | | | | 361/700 |
| 2016/0227669 | A1* | 8/2016 | Kwon | G11B 33/142 |
| 2017/0223870 | A1 | 8/2017 | Smith | |
| 2017/0325358 | A1* | 11/2017 | Franz | H05K 7/20781 |
| 2017/0358556 | A1* | 12/2017 | Bitz | H01L 25/0657 |
| 2018/0020571 | A1* | 1/2018 | Saito | H05K 7/20636 |
| 2018/0053533 | A1* | 2/2018 | Smith | G06F 1/182 |
| 2018/0092243 | A1 | 3/2018 | Saito et al. | |
| 2018/0376615 | A1* | 12/2018 | Saito | H05K 7/20781 |
| 2019/0289748 | A1 | 9/2019 | Saito | |
| 2020/0390007 | A1* | 12/2020 | Edmunds | H05K 7/20272 |
| 2022/0003511 | A1* | 1/2022 | Embleton | B32B 3/30 |
| 2022/0007544 | A1* | 1/2022 | Embleton | H05K 7/20454 |

FOREIGN PATENT DOCUMENTS

| | | | |
|---|---|---|---|
| WO | 2010130993 | A2 | 11/2010 |
| WO | 2014132086 | | 9/2014 |
| WO | 2016117098 | A1 | 7/2016 |
| WO | 2018096362 | A1 | 5/2018 |
| WO | 2019048864 | A1 | 3/2019 |
| WO | 2019132696 | A1 | 7/2019 |
| WO | 2021161026 | A1 | 8/2021 |

OTHER PUBLICATIONS

GB Search Report issued in App. No. GB2001872.7, dated Jul. 3, 2020, 4 pages.
Office Action of the China Patent Office in related Chinese Appl. No. 202180013611.8, dated Jan. 26, 2025, 9 pages.

* cited by examiner

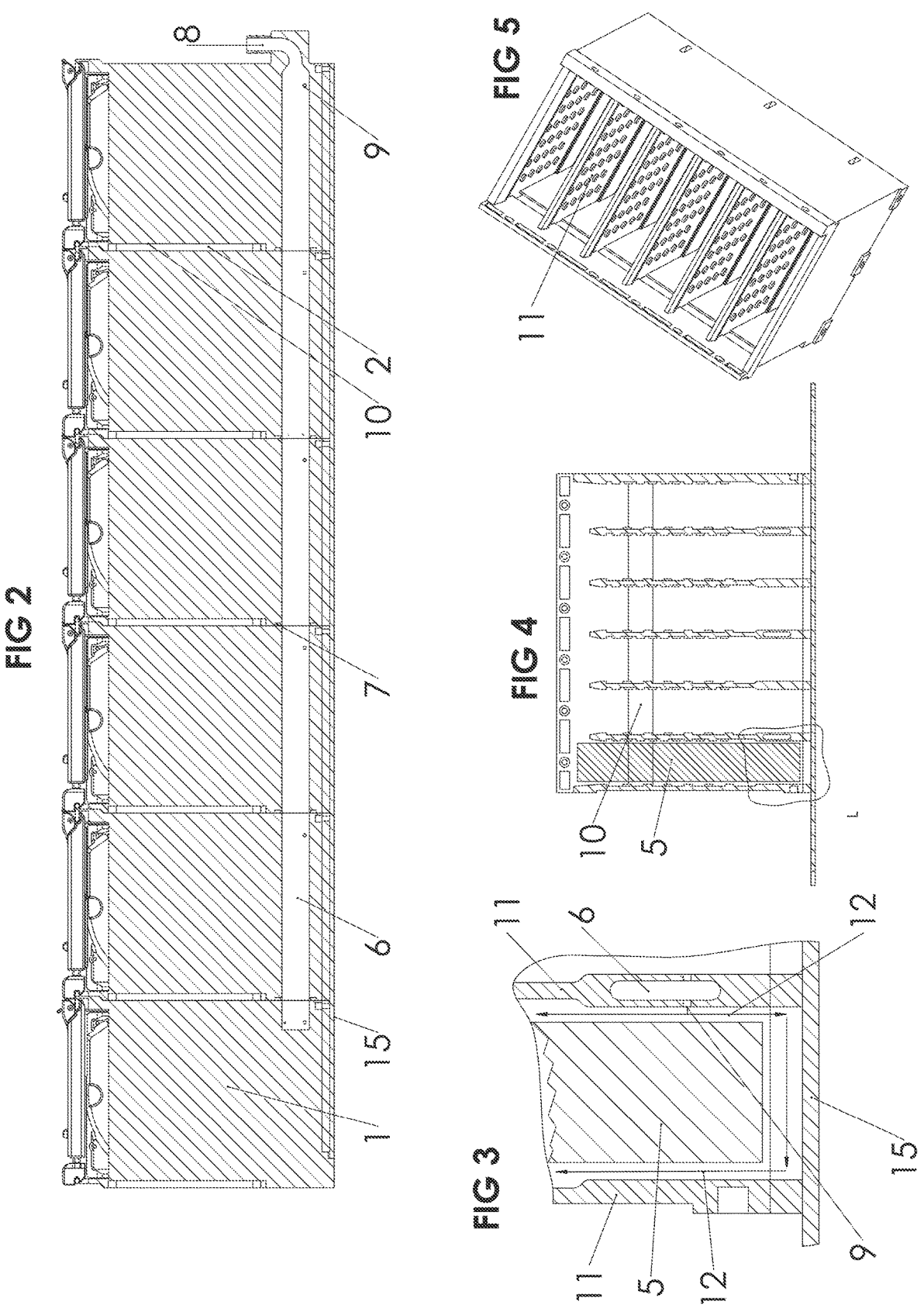

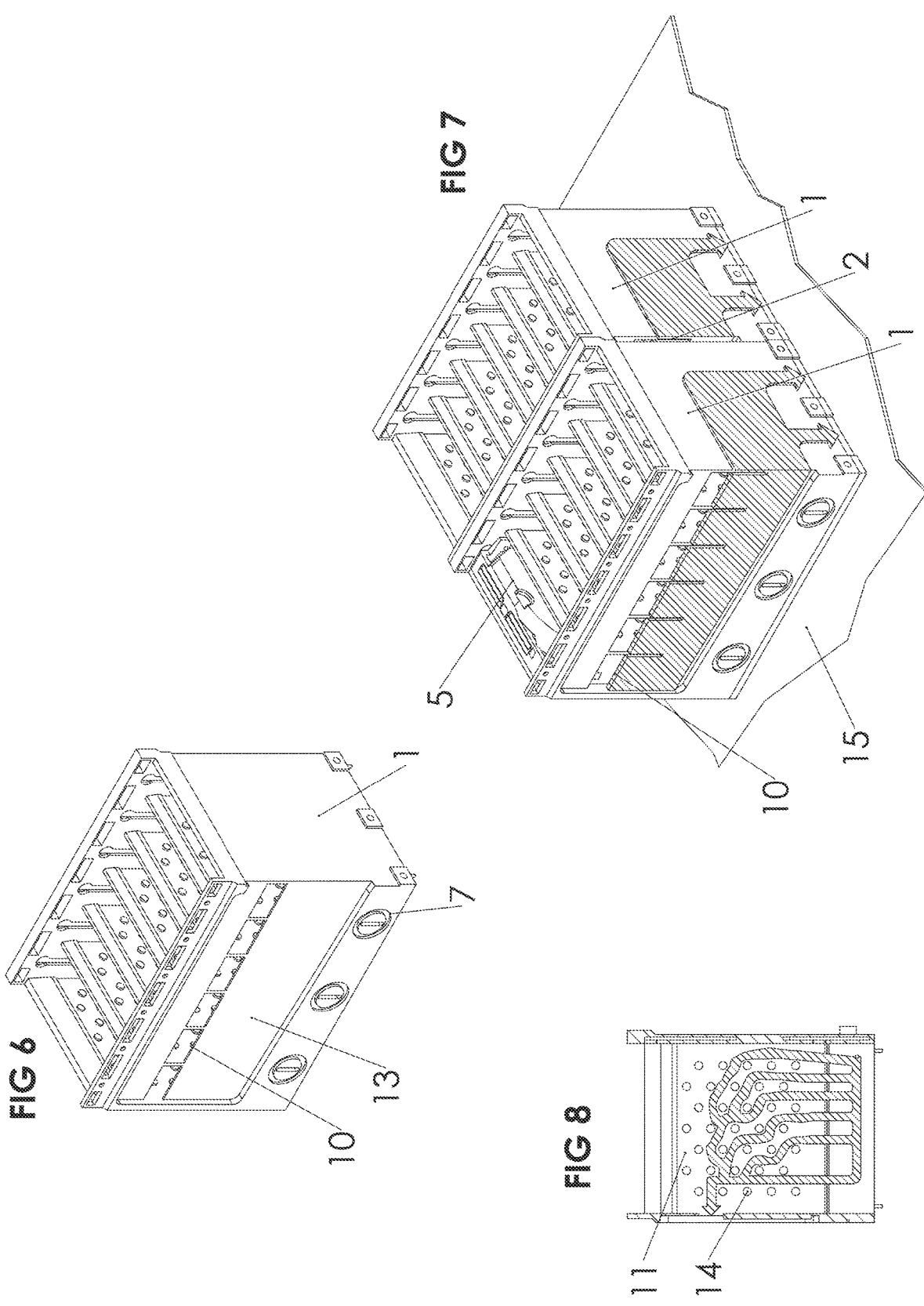

SECTION A-A

HOUSING FOR IMMERSIVE LIQUID COOLING OF MULTIPLE ELECTRONIC DEVICES

TECHNICAL FIELD OF THE DISCLOSURE

The disclosure concerns a housing for mounting within an enclosure that is arranged to contain a liquid coolant. A module for cooling electronic devices using a liquid coolant comprising such a housing is also provided.

BACKGROUND OF THE DISCLOSURE

Historically, almost all mass manufactured Information Technology (IT) or data storage racks are designed for air cooled systems. This is usually achieved with a mixture of fans on each IT tray or chassis and cooling on the facility side with air conditioning for instance. This method of cooling is not efficient and has a high running cost. It also uses large amounts of space to have hot and cold isles. For mass-manufactured IT or server equipment, such air-cooling has been used almost exclusively. Other types of cooling have generally been considered only for bespoke, non-commercial systems.

In more recent times, the heat generation of standard IT components is getting too great to be cooled effectively by air alone and this inability may limit the peak performance of such devices. As technology is generally predicted to halve in size for the same performance every couple of years (Moore's law), the search for a more effective way of cooling these heat producing components increases. This has led to numerous methods of cooling IT using a liquid as a coolant. These liquids include dielectric fluids, mineral oil and water to mention a few.

Such methods usually involve: a primary liquid coolant, in contact with the heat generating component or components; and a secondary liquid coolant, which receives heat from the primary liquid coolant through a heat exchanger and is normally on the facility side. Examples of such approaches are disclosed in International (PCT) Patent Application Publication numbers 2010/130993, 2014/132086, 2018/096362 and 2019/048864, all of which are commonly owned with the present disclosure and their contents incorporated by reference. Other approaches are possible though, using cooling technologies such as cold plates, in which a primary liquid coolant need not be in direct contact with the heat generating component or components and/or which may use only one liquid coolant through the system without a liquid-to-liquid heat exchanger.

Existing approaches for cooling IT components are focused on motherboard-based systems, including blade servers and other types of computer server configurations. Mass data storage systems and IT components may also benefit from liquid cooling. These may include systems comprising a JBOD ("Just a Bunch of Drives") that use an array of Hard Disk Drives (HDDs) and one or more other storage devices, for example a Solid State Drive (SSD) and a drive based on the M.2 standard. Such data storage systems can be housed in a single enclosure within a rack. Uniform performance and device life is desirable: this difficult to control with air-cooling, as the fan-side devices are cooled much more efficiently than their opposing devices due to air being heated through the system. Similar issues may apply to other architectures using multiple IT components within a single chassis. Liquid cooling may offer advantages to such designs, but implementing liquid cooling for them presents a challenge, due to their different form and desiderata.

SUMMARY OF THE DISCLOSURE

Against this background, there is provided a housing for mounting within an enclosure (which may be sealable) that is arranged to contain a liquid coolant module in accordance with claim 1 and a module for cooling electronic devices using a liquid coolant according to claim 20. Further preferable and/or advantageous features are identified in the dependent claims and in the remaining disclosure herein. A method of manufacturing and/or operating such a housing and/or such a module having steps corresponding with the structural features described herein may also be considered.

The disclosure provides a housing of multiple heat generating components, in particular IT components such as HDDs, which allows the components to fit within the housing with adaptations such that a set, minimal amount of evenly-distributed liquid coolant can flow around each component or components to give even (and preferably, optimum) cooling. The housing is generally provided within an enclosure (which may be sealed or sealable) and will typically form part of a coolant loop, in which a liquid coolant (for example, comprising a dielectric liquid) is used to cool the heat generating components in the housing and/or other heat generating components within the enclosure, before heat is transferred from the liquid coolant (possibly to another liquid and/or gaseous coolant) before being carried away from the enclosure. The coolant loop may include a pump and/or heat exchanger, one or both of which are preferably also within the enclosure.

Each housing may hold a set number of heat generating components. Each heat generating component typically has its own bay, for example at least partly formed by side walls of the housing, although some bays could hold multiple components. Within each housing exists a (small) integrated through-manifold or manifolds which allow coolant to be fed to each bay (in parallel) respectively. Each manifold has multiple outlets which allows it to feed specific bays (that is, one or more manifold outlets, or equivalently bay inlets, per bay). Liquid coolant accumulates in each bay around the heat generating components, cooling it thereby. The bays may all be the same or they may be different.

The integrated manifold is advantageously located at the bottom of the housing, allowing coolant to be fed from the bottom rising upward and evenly around the heat generating component in the bay. Each bay may have four sides (defined by the side walls). This may be formed from one front side wall, one back side wall and two larger side walls together creating an isolated bay, for instance having a generally cuboid shape. The position of these walls beneficially dictates the amount of liquid coolant forming a layer around the heat generating component, which is desirable to minimise the coolant amount and/or calibrate (or optimise) the flow rate of the liquid coolant.

A Printed Circuit Board (PCB) or other type of circuit board advantageously provides the base for the housing, as well as connections for the IT mounted within it. The base PCB is advantageously sealed to the side walls, to allow accumulation of coolant in the bays.

The side walls optionally also include small bosses, pillars, notches or grooves or other types of indentation and/or projection, which may dictate a specific flow path around a heat generating component in the bay and act as a guide for the heat generating component to allow accurate alignment to a connecting PCB or other IT forming the base of the housing. The liquid coolant can then rise to a specific height relative to the heat generating component in the bay. At this height, the liquid coolant can exit via an outlet port, for example located at the rear of the housing, and is dumped into a returning sump.

Multiple housings may be provided and beneficially coupled together, for example in parallel. For example, part of the manifold may provide an opening to couple with the manifold and/or coolant inlet of other housings. In that case, the opening (and/or other parts of the manifold) may be sealed for some housings, so as to prevent coolant passing through the sealed parts of the manifold (for instance, to provide an end point for the coupled housings).

BRIEF DESCRIPTION OF THE DRAWINGS

The disclosure may be put into practice in a number of ways and preferred embodiments will now be described by way of example only and with reference to the accompanying drawings, in which:

FIG. 2 shows a first section view through the embodiment of FIG. 1;

FIG. 3 illustrates a second section view through the embodiment of FIG. 1, showing an HDD in a portion of the housing;

FIG. 4 depicts a third section view through an arrangement in accordance with the embodiment of FIG. 1 with only a single HDD present;

FIG. 5 illustrates an isometric view of a single housing, showing the front;

FIG. 6 depicts an isometric view of the housing of FIG. 5, showing the rear;

FIG. 7 shows a rear isometric view of two of the housings of FIGS. 5 and 6 coupled together and mounted on a PCB;

FIG. 8 illustrates a section view of a single housing, showing a coolant accumulation path within a bay of the housing;

All drawings are schematic in nature. Identical components are illustrated in different drawings using the same reference numerals.

DETAILED DESCRIPTION OF PREFERRED EMBODIMENTS

Figure 1:
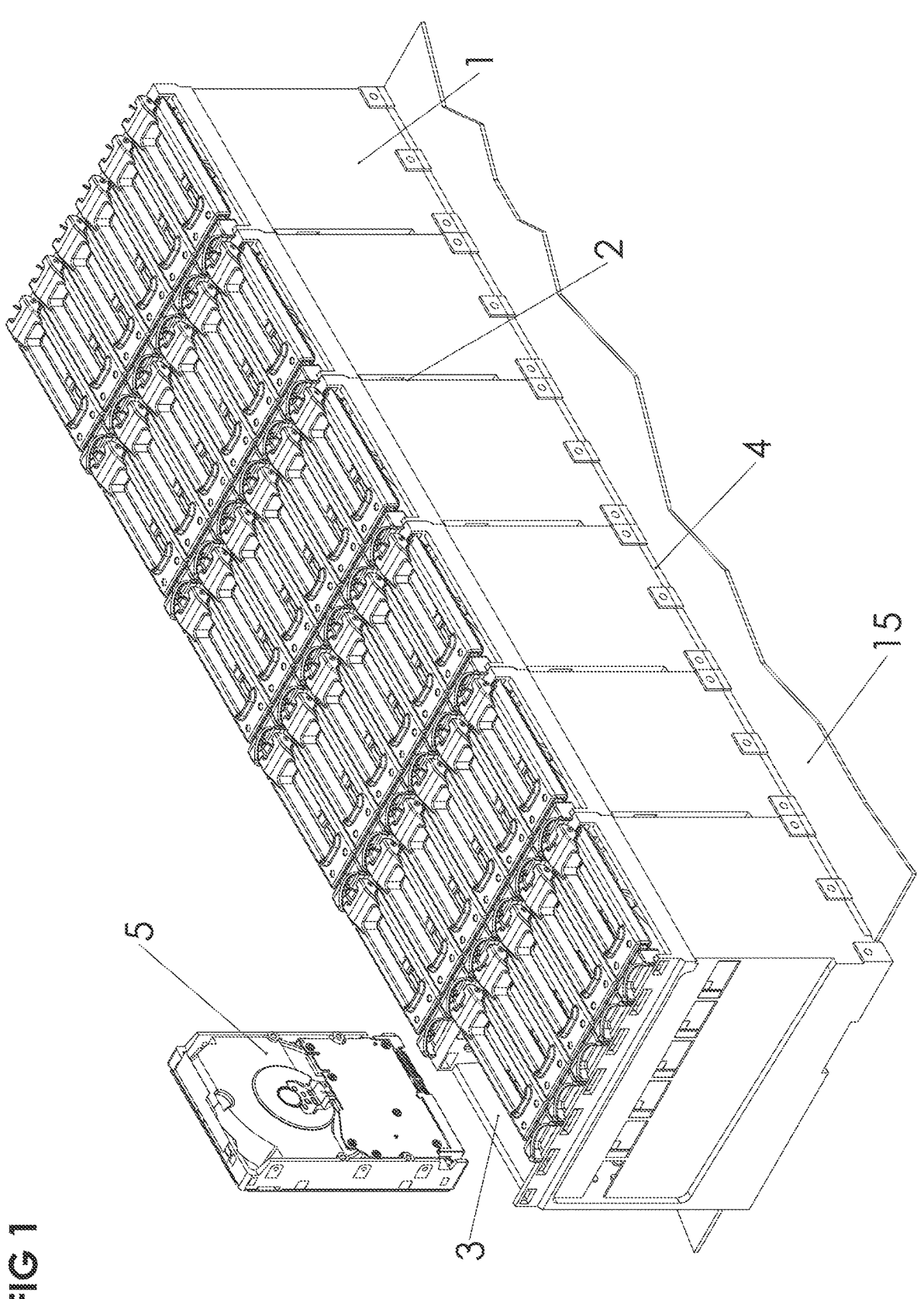
FIG. 1 depicts a perspective view of an arrangement of assembled housings in accordance with an embodiment.

Referring first to FIG. 1, there is depicted a perspective view of an arrangement of assembled housings in accordance with an embodiment. Each housing 1 (six such housings are shown in this arrangement) defines a plurality of bays 3 (as shown, six bays 3 are shown per housing 1). In this example, the housing is designed to fit HDDs 5, with a single HDD 5 shown in an exploded view and other HDDs 5 being mounted in the remaining bays 3. Other IT components or heat generating devices may be substituted for HDDs 5, subject to the comments below regarding the fit within the housing. The housing 1 is typically located in a chassis (not shown). Also provided in the chassis may be: a pump, for controlled flow of liquid coolant within the chassis and/or housing; and a heat exchanger, for transferring heat from the liquid coolant to a secondary coolant (which is preferably liquid and more preferably water-based, for example using building water). The secondary coolant is then used to transfer the heat away from the chassis. The chassis may be provided in a rack or other suitable structure, which may also house other chassis of the same or different type.

The design of housings 1 is modular, such that the housings 1 are fastened together in parallel to create a sealed connection between housings 1. The modular nature of the design allows any number of housings 1 to be connected in parallel. On the side of each housing 1 are outlet slots 2, in which liquid coolant can flow out from the bays 3. A gasket or other seal 4 on the base of the housing 1 creates a seal to a PCB 15 around a connecting HDD socket (not shown) to prevent coolant escaping from the individual bays 3.

The design of the housing 1 will now be discussed in more detail, firstly with reference to FIG. 2, in which there is shown a first section view through the embodiment of FIG. 1. This shows the flow of liquid coolant through the housings 1. There is provided: an inlet port 8; an integrated manifold 6; a manifold outlet hole 9; a bay outlet hole 10; and an inter-housing seal 7. The inter-housing seal 7 prevent leaking and maintain the desired flowrate of liquid coolant, as will be discussed further below.

Liquid coolant is fed through the inlet port 8 at one end of the arrangement via a hose connection (not shown). The integrated manifold cavity 6 at the bottom of each housing 1 allows liquid coolant to pass through each housing 1 in line, without pre-heating occurring. The small manifold outlet hole 9 (or equivalently, bay inlet hole, which may connect to, or be referred to in some embodiments disclosed herein as a "chamber coolant inlet") breaks through the integrated manifold 6, allowing liquid coolant to be distributed into each bay 3 in parallel. The sizes of the integrated manifold 6 and the outlet hole 9 are specific and can be set depending on the flow rate required to ensure equal cooling for each bay 3 (such that different bays may have different flow rates in some circumstances). The integrated manifold 6 and the manifold outlet hole 9 thereby allow the distribution of fresh and cold liquid coolant to every bay 3, before any other heat sources can be exposed to the coolant.

Delivering even coolant to each HDD bay is possible with this parallel coolant feed. It is not possible to evenly cool HDDs using air, because air pushed from the front of the system will heat up as it passes more heat emitting HDDs. This is combated in air-cooled systems by leaving gaps between all the components to promote air flow. This reduces HDD density. Such disadvantages are not present with designs in accordance with the disclosure. In the design shown, the volume of the bay 3 is approximately 13.8% larger than the HDD 5, although a range between 1% and 20% is considered appropriate, depending on the cooling desiderata.

Each housing 1 is fastened to a mating housing 1 and the integrated manifold 6 is sealed to a following housing using the seal groove and seal 7, creating a run of parallel-fed fresh liquid coolant paths.

The integrated manifold outlet hole 9 is positioned at the opposite end of the bay 3 to the outlet port 10. This causes fresh liquid coolant to travel from one side of a bay 3 to the other side of the bay 3, ensuring the longest route possible. This maximises the time taken for the liquid coolant to flow from the integrated manifold outlet hole 9 to the outlet port 10, increasing the time for the coolant to absorb the heat from the HDD 5. The outlet port 10 is set at a specific height, such that the majority of a side of the HDD 5 is submerged in the coolant.

Replacement dummy HDDs (for example, in the same shape and size as HDD devices) may be used in place of HDD 5 or dummy SSDs (for example, in the same shape and size as SSD devices) may be used instead of SSD devices or dummy M.2 devices (for example, in the same shape and size as a M.2 devices) may be used instead of M.2 devices. This may be generalised to a dummy cartridge or device in the same size and shape as the device that would normally fit into the bay 3. The replacement dummy devices may be clipped into the same fitting of the bay 3 as the HDD 5. Advantageously, the dummy device is dimensioned to displace the same amount of coolant as the HDD 5.

In general terms, there may be considered a housing for mounting within an enclosure that is arranged to contain a liquid coolant. The housing comprises: a wall structure, arranged to define a plurality of mounting chambers, each mounting chamber being configured to hold at least one respective electronic device (for example, one or more hard disk drives) and having a respective chamber coolant inlet for receiving liquid coolant; a housing coolant inlet, for receiving liquid coolant from outside the housing; and a liquid coolant manifold (preferably integrated within the housing and/or wall structure), arranged to receive liquid coolant from the housing coolant inlet and provide the received liquid coolant (preferably, in parallel) to each of the chamber coolant inlets. The wall structures are configured and/or the mounting chambers are defined such that liquid coolant received through each chamber coolant inlet accumulates in the respective mounting chamber around the respective electronic device. In this way, an even flow rate and/or distribution of liquid coolant is provided to each mounting chamber and to thereby efficiently and effectively cool the electronic device held in the mounting chamber.

In further general terms, there may also be considered a module for cooling electronic devices using a liquid coolant. The module comprises: an enclosure (which may be sealable) within the module, for receiving liquid coolant (and arranged such that the liquid coolant may accumulate in the enclosure or at least a part thereof); and a housing as disclosed herein, mounted within the enclosure. The enclosure may be defined by a chassis. A plurality of electronic devices may be provided, each electronic device being mounted in a respective mounting chamber of the housing. Additionally or alternatively, the liquid coolant is provided in the enclosure. Optionally, the module may further comprise a pump, arranged to (receive liquid coolant from within the enclosure and) cause liquid coolant to flow to the housing coolant inlet. In some embodiments, a heat exchanger is provided (advantageously within the enclosure), arranged to receive the liquid coolant as a primary liquid coolant, to receive a secondary liquid coolant (that is advantageously isolated from the primary liquid coolant) and transfer heat from the primary liquid coolant to the secondary liquid coolant. Multiple housings may be provided in a single module, for instance such that the housing is a first housing and the module further comprises: a second housing as disclosed herein, mounted within the enclosure and arranged to receive liquid coolant at the housing coolant inlet of the second housing in parallel with receiving liquid coolant at the housing coolant inlet of the first housing.

Further optional and/or preferable features of the housing and/or module will be discussed below and may be applied to any configuration as disclosed herein.

In the preferred embodiments, the housing further comprises: a base, configured to define a lower extent of the plurality of mounting chambers. Advantageously, the housing coolant inlet is adjacent the base (and/or closer to the base than to an end of the wall structure distal the base).

Preferably, the wall structure is arranged such that each of the plurality of mounting chambers is defined by respective side walls, to isolate the flow of liquid coolant within the respective mounting chamber from other mounting chambers (each side wall dividing one mounting chamber from another mounting chamber or the outside of the housing). The wall structure may be arranged such that the form of each of the plurality of mounting chambers is identical or such that the form of at least some of the plurality of mounting chambers is non-identical. For example, it may be advantageous to cool different electronic devices (such as different types of storage device) in a single housing or to cool electronic devices having different cooling requirements in the same housing. In embodiments, each of the plurality of mounting chambers has a respective chamber coolant outlet for the flow of liquid coolant from within the respective mounting chamber to outside the housing. In particular, the wall structure is arranged such that a mounting chamber of (each of) the plurality of mounting chambers is defined by four side walls to define a cuboid-shaped mounting chamber, for example such that the four side walls comprise two larger side walls and two smaller side walls. Then, the chamber coolant outlet of the mounting chamber may be positioned on one of the larger side walls. Additionally or alternatively, the chamber coolant inlet may be provided on a side wall of the mounting chamber opposite to the side wall of the mounting chamber on which the chamber coolant outlet is positioned. In embodiments, the respective chamber coolant outlet of each of the plurality of mounting chambers is located in a part of the respective mounting chamber distal the base (and/or closer to an end of the wall structure distal the base than to the base). In other words, the chamber coolant outlet is advantageously located towards the top of the mounting chamber.

Advantageously, the wall structure is arranged such that the volume of a mounting chamber is no more than (or less than) 25%, 20%, 17.5%, 15%, 12.5%, 10%, 5%, 3%, 2% or 1% larger than the volume of the one or more electronic devices held in the mounting chamber. Additionally or alternatively, the wall structure is arranged so as to cause an even flow of liquid coolant within the mounting chamber holding the electronic device.

In preferred embodiments, the housing coolant inlet comprises: a plurality of housing coolant inlet parts, each housing coolant inlet part being configured to receive liquid coolant from outside the housing. Then, the liquid coolant manifold comprises a plurality of liquid coolant manifold parts, each liquid coolant manifold part being arranged to receive liquid coolant from a respective housing coolant inlet part and provide the received liquid coolant (in parallel) to each of some of the chamber coolant inlets. In some embodiments, three such liquid coolant manifold parts and three corresponding housing coolant inlet parts may be provided. The housing coolant inlet parts may be coupled (in parallel) to a single housing coolant inlet port in certain embodiments.

A (removable) manifold seal may be arranged for sealing a portion of the liquid coolant manifold (or a housing coolant inlet part) that is not in use may be provided in some implementations. In one, more than one or all of the plurality of mounting chambers in which an electronic device is not held, a (removable) dummy device may be provided. The dummy device may have the same shape and/or dimensions as the electronic device for which the respective mounting chamber is intended.

In embodiments, a housing arrangement comprising multiple housings as disclosed above may be considered. In general terms, this may also be termed a housing for mounting within an enclosure (for example, a sealable or sealed enclosure) that is arranged to contain a liquid coolant. This housing comprises: a plurality of sub-housings arranged in a sequence, each sub-housing being formed by a housing as disclosed above. Then, the housing coolant inlet of a first sub-housing in the sequence is beneficially configured for receiving liquid coolant from outside the housing and the respective housing coolant inlet of each other sub-housing in the sequence is beneficially configured to receive liquid coolant from the liquid coolant manifold of the preceding sub-housing in the sequence. The liquid coolant manifold of the last sub-housing in the sequence may comprise a sealed end, the respective liquid coolant manifold of each other sub-housing in the sequence comprising an unsealed end, configured to couple with the housing coolant inlet of the next sub-housing in the sequence. A seal (an inter-housing seal) may be provided between a liquid coolant manifold of one sub-housing in the sequence and a liquid coolant manifold of a next sub-housing in the sequence.

Specific details and/or embodiments will now be discussed. Further reference to the generalised descriptions discussed above will be made below.

Referring to FIG. 3, there is illustrated a second section view through the embodiment of FIG. 1, showing a HDD 5 in a portion of the housing 1. Further shown in this drawing are: bay side wall 11; and coolant flow path 12. The path of the manifold 6 and manifold outlet hole 9 through the bay side wall 11 is shown.

Each bay side wall 11 is utilised not only as a guide for inserting the HDDs 5, but also to allow the minimum volume of liquid coolant required to cool an HDD 5 with even coolant distribution. This is due to a very small sectional area between the side wall 11 and the HDD 5. This spreads the minimum amount of coolant across the side wall of the HDD 5, such that minimum liquid coolant is used, leading to lower power consumption and lower flow rate.

Referring next to FIG. 4, there is depicted a third section view through an arrangement in accordance with the embodiment of FIG. 1 with only a single HDD present. This view shows detail of the bay outlet hole 10 height. As shown in the preceding drawings, the integrated manifold 6 is positioned at the bottom of the bay 3. This allows coolant to rise up into the volumes each side of the HDD 5, such that both sides of the HDD 5 are equally and evenly cooled.

With reference to FIG. 5, there is illustrated an isometric view of a single housing 1, showing the front and with reference to FIG. 6, there is depicted an isometric view of the housing 1, showing the rear. The bays 3 are separated by side walls 11. Each bay 3 has an outlet port 10, for coolant to flow therethrough once it accumulates to the height of the outlet port 10. Once the coolant leaves the outlet port 10, it enters a channel at least partly defined by a rear cavity 13 in the housing 1, as will discussed further below, with reference to FIG. 7.

Also visible in FIGS. 5 and 6 are the seals 7 at the end of the manifolds 6, with three such manifolds being present in the embodiment shown. Each manifold 6 therefore supplies coolant to two bays 3 in each housing 1.

Reference is now made to FIG. 7, in which there is shown a rear isometric view of two of the housing 1 coupled together and mounted on a PCB. This allows more details of the flow path of liquid coolant leaving the bays 3. In this example, one bay 3 is filled with an HDD 5.

The rear cavity 13 is open and is mated to the following housing 1, creating a channel (or chamber) for the flow of liquid coolant. The outlet for the liquid coolant from this channel is provided by the outlet slot 2. As discussed above, each bay 3 has its own independent outlet port 10. This allows each HDD 5 (or other device) to be cooled independently within the parallel liquid cooling feed circuit. Liquid coolant from each bay 3 exits independently into the rear cavity 13 and then flows from the housing 1 through the outlet slots 2 located on the side of the housing 1 into a sump within the system (not shown). The exit flow path is shown on the drawing by the shading region with arrows.

The outlet port 10 is sized appropriately to allow a quick exit flow of coolant, with no overspill when inserting an HDD 5. It is notable that the size of the outlet port 10 is much larger than the size of the bay inlet port (or manifold outlet hole) 9, also allowing the manifold to control the flow rate of coolant through the bays 3. The rear cavity 13 and the outlet slots 2 are sized (in terms of area) appropriately, such that coolant can escape before filling and re-entering the housing 1 at a predetermined and dedicated flow rate.

With reference to the general terms discussed above, the housing and/or module may further comprise a liquid coolant sump, such that liquid coolant flows from each of the plurality of mounting chambers through a respective chamber coolant outlet to outside the housing via the liquid coolant sump.

Next referring to FIG. 8, there is illustrated a section view of a single housing 1, showing a coolant accumulation path within a bay 3 of the housing 1. On the side wall 11 of the bay 3, small, specifically-spaced bosses 14 are formed. These bosses 14 disrupt the coolant flow around the HDD 5 (shown by a shading region with arrows in the drawing), to create a non-linear flow path. The bosses 14 elongate the flow path, increasing the absorption of heat by the coolant and promote mixing of coolant. These effects create a more even coolant temperature across the sides of the HDD 5.

Further reference to the general terms discussed above is again made. For each of the plurality of mounting chambers, at least one side wall defining the respective mounting chamber may comprise one or more indents and/or projections, for example to define a flow path for liquid coolant within the respective mounting chamber and/or to act as a guide for insertion and removal of an electronic device within the respective mounting chamber. Optionally, the one or more indents and/or projections comprise one or more of: a groove; a notch; a boss; and a pillar.

Figure 9:
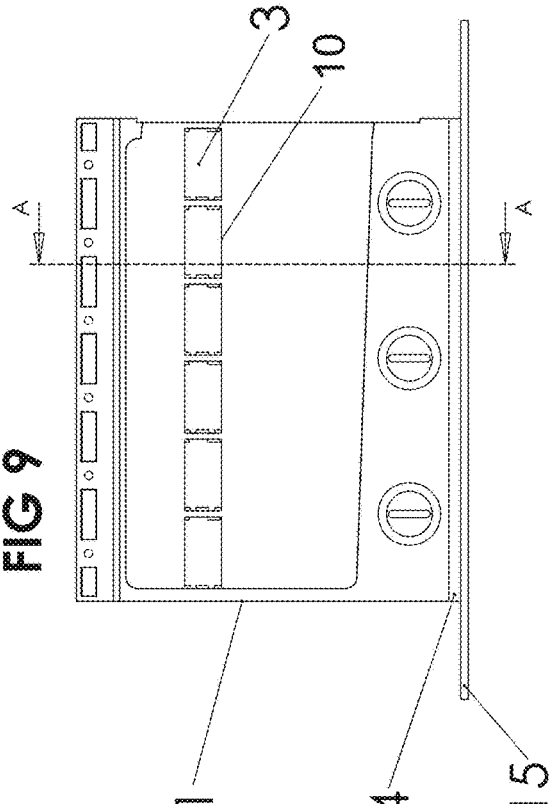
FIG. 9 depicts a rear view of a housing according to the disclosure mounted on a PCB.

Referring now to FIG. 9, there is depicted a rear view of a housing 1 mounted on a PCB 15. The housing 1 is mounted on the PCB 15 and provided with a base seal 4 to create a seal between a PCB 15 and the housing 1. As a result, minimal coolant (and preferably no coolant) can escape from the bay 3, except via the outlet port 10. This allows each bay 3 to fill at a predetermined or calculated rate.

Figure 10:
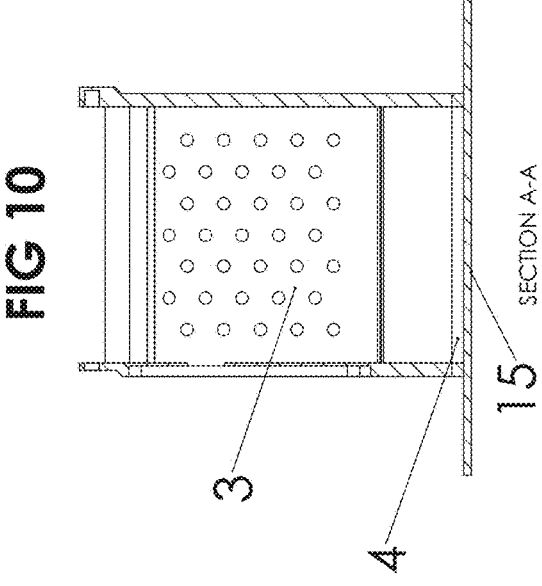
FIG. 10 shows a section view of the housing according to the disclosure mounted on a PCB.
Figure 11:
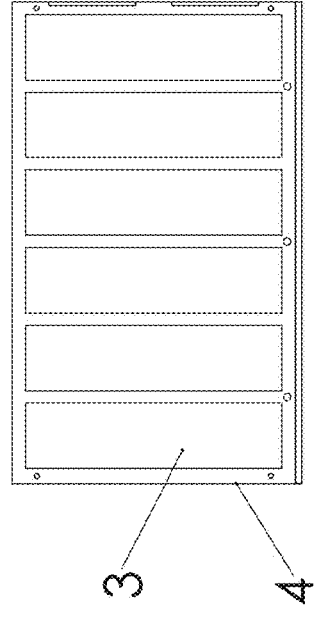
FIG. 11 illustrates a bottom view the housing according to the disclosure mounted on a PCB.
Figure 12:
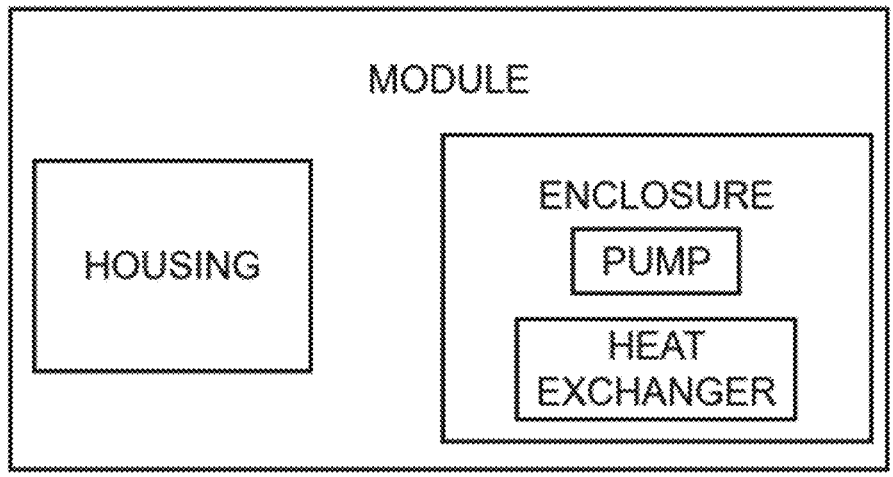
FIG. 12 shows a schematic representation of an example module as disclosed herein.

In FIG. 9, a section line A-A is shown. With reference to FIG. 10, there is shown a section view of the housing 1 along the line A-A. Referring to FIG. 11, there is illustrated a bottom view of the housing 1. The base seal 4 also separates the bays 3, such that the bays 3 are independently sealed from one another. In this way, the flow rate of liquid coolant to each HDD 5 in the respective bay 3 is even and in turn, the cooling between bays 3 is also even.

In the general terms discussed above, there may be further provided a base seal, configured to provide a liquid-tight seal between the base and the wall structure. For example, the base may be formed by a (printed) circuit board. Then, the circuit board may have a plurality of connections, each connection being arranged for interfacing with a respective electronic device held in a respective mounting chamber.

Although specific embodiments have now been described, the skilled person will appreciate that various modifications and alternations are possible. In particular, different shapes and configurations of housing are possible, including different liquid coolant flow paths within, between and/or outside the housing. The type of electronic (or other heat generating) device cooled by in the housing may vary. The exact shape and/or size of the bays may also be modified, as may the number of bays per housing and the arrangement of bays and/or manifolds within the housing. In alternative approaches, a bay may hold more than one electronic device, for example so that each bay could hold two HDDs. This could be applied to one, some or all bays in a particular housing.

As discussed above, a modular design of housing is preferred. In the example described herein, six housings are used, but this could be increased or decreased if required simply by removing or adding another housing 1. The housings 1 are all identical in the example, but this need not be the case and for instance, housing with different numbers of bays might be coupled together. In any event, the integrated coolant manifold 6 is still designed to run between housings for interconnectivity.

Although a pump may be used for the flow of liquid coolant within the chassis (and/or housing), convection may additionally or alternatively be used to cause the flow of liquid coolant.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A module for cooling electronic devices using a liquid coolant, comprising:
   an enclosure within the module, for receiving and containing the liquid coolant;
   a pump and a heat exchanger, both located within the enclosure, the heat exchanger being arranged to receive the liquid coolant as a primary liquid coolant, to receive a secondary liquid coolant and to transfer heat from the primary liquid coolant to the secondary liquid coolant; and
      a housing mounted within the enclosure, wherein the housing is a first sub-housing of a plurality of sub-housings arranged in a sequence, each other sub-housing of the plurality of sub-housings being formed by a respective other housing that comprises:
   a wall structure, arranged to define a plurality of mounting chambers, each mounting chamber being configured to hold at least one respective electronic device and having a respective chamber coolant inlet for receiving the liquid coolant, such that the liquid coolant received through each chamber coolant inlet accumulates in the respective mounting chamber around the respective electronic device;
   a housing coolant inlet, for receiving the liquid coolant from outside the housing, the pump being arranged to cause the liquid coolant to flow to the housing cooling inlet; and a liquid coolant manifold, arranged to receive the liquid coolant from the housing coolant inlet and provide the liquid coolant to each of the chamber coolant inlets,
      wherein each sub-housing includes a seal disposed between the liquid coolant manifold of that sub-housing, and the liquid coolant manifold of the next sub-housing in the sequence.

2. The module of claim 1, the housing further comprising:
   a base, configured to define a lower extent of the plurality of mounting chambers.

3. The module of claim 2, wherein the housing coolant inlet is adjacent the base.

4. The module of claim 2, further comprising:
   a base seal, configured to provide a liquid-tight seal between the base and the wall structure.

5. The module of claim 2, wherein the base is formed by a circuit board, the circuit board having a plurality of connections, each connection being arranged for interfacing with a respective electronic device held in a respective mounting chamber.

6. The module of claim 1, wherein the wall structure is arranged such that each of the plurality of mounting chambers is defined by respective side walls, to isolate the flow of the liquid coolant within the respective mounting chamber from other mounting chambers.

7. The module of claim 6, wherein, for each of the plurality of mounting chambers, at least one side wall defining the respective mounting chamber comprises one or more indents and/or projections to define a flow path for the liquid coolant within the respective mounting chamber and/or to act as a guide for insertion and removal of the at least one electronic device within the respective mounting chamber.

8. The module of claim 7, wherein the one or more indents and/or projections comprise one or more of: a groove; a notch; a boss; and a pillar.

9. The module of claim 8, wherein each of the plurality of mounting chambers has a respective chamber coolant outlet for the flow of the liquid coolant from within the respective mounting chamber to outside the housing.

10. The module of claim 9, wherein the housing further comprises a liquid coolant sump, such that the liquid coolant flows from each of the plurality of mounting chambers through a respective chamber coolant outlet to outside the housing via the liquid coolant sump.

11. The module of claim 9, wherein the housing further comprises a base and wherein the respective chamber coolant outlet of each of the plurality of mounting chambers is located in a part of the respective mounting chamber distal the base.

12. The module The housing of claim 9, wherein the wall structure is arranged such that a mounting chamber of the plurality of mounting chambers is defined by four side walls to define a cuboid-shaped mounting chamber.

13. The module of claim 12, wherein the four side walls comprise two larger side walls and two smaller side walls, the chamber coolant outlet of a mounting chamber of the plurality of mounting chambers being positioned on one of the larger side walls.

14. The module of claim 1, wherein the housing further comprises at least one electronic device and wherein the wall structure is arranged such that a volume of a mounting chamber of the plurality of mounting chambers is no more than 20% larger than a volume of the at least one electronic device and/or wherein the wall structure is arranged so as to cause an even flow of the liquid coolant within the mounting chamber of the plurality of mounting chambers holding the electronic device.

15. The module of claim 1, wherein the wall structure is arranged such that the form of each of the plurality of mounting chambers is identical.

16. The module of claim 1, wherein the housing coolant inlet comprises: a plurality of housing coolant inlet parts, each housing coolant inlet part being configured to receive the liquid coolant from outside the housing and wherein the liquid coolant manifold comprises a plurality of liquid coolant manifold parts, each liquid coolant manifold part being arranged to receive the liquid coolant from a respective housing coolant inlet part and provide the received liquid coolant to each of some of the chamber coolant inlets.

17. The module of claim 1, further comprising:
a removable manifold seal, arranged for sealing a portion of the liquid coolant manifold that is not in use.

18. The module of claim 1, wherein the electronic devices are hard disk drives.

19. The module of claim 1,
wherein the first sub-housing is a first sub-housing in the sequence and wherein the housing coolant inlet of the first sub-housing in the sequence is configured for receiving the liquid coolant from outside the plurality of sub-housings and wherein the respective housing coolant inlet of the each other sub-housing of the plurality of sub-housings is configured to receive the liquid coolant from the liquid coolant manifold of a preceding sub-housing in the sequence.

20. The module of claim 1, further comprising:
a plurality of electronic devices, each electronic device being mounted in a respective mounting chamber of the housing; and
wherein the liquid coolant is provided in the enclosure.

21. The module of claim 1, wherein the housing is a first housing, the module further comprising:
a second housing, mounted within the enclosure, the second housing comprising:
a wall structure, arranged to define a plurality of mounting chambers, each mounting chamber being configured to hold at least one respective electronic device and having a respective chamber coolant inlet for receiving the liquid coolant, such that the liquid coolant received through each chamber coolant inlet accumulates in the respective mounting chamber around the respective electronic device;
a housing coolant inlet, for receiving the liquid coolant from outside the housing; and
a liquid coolant manifold, arranged to receive the liquid coolant from the housing coolant inlet and provide the liquid coolant to each of the chamber coolant inlets; and
wherein the second housing is arranged to receive the liquid coolant at the housing coolant inlet of the second housing in parallel with receiving the liquid coolant at the housing coolant inlet of the first housing.

22. The module of claim 1, wherein the enclosure is defined by a chassis.

* * * * *